US007824191B1

(12) United States Patent
Browder (10) Patent No.: US 7,824,191 B1
(45) Date of Patent: Nov. 2, 2010

(54) CONNECTOR WITH CONDUCTOR PIERCING PRONGS FOR A SOLAR PANEL

(75) Inventor: John H. Browder, Roanoke, TX (US)

(73) Assignee: International Development LLC, Roanoke, TX (US)

( * ) Notice: Subject to any disclaimer, the term of this patent is extended or adjusted under 35 U.S.C. 154(b) by 0 days.

(21) Appl. No.: 12/609,561

(22) Filed: Oct. 30, 2009

Related U.S. Application Data

(63) Continuation-in-part of application No. 12/542,600, filed on Aug. 17, 2009.

(51) Int. Cl.
    *H01R 12/00* (2006.01)
(52) U.S. Cl. .................................................. 439/76.1
(58) Field of Classification Search ............... 439/76.1, 439/404, 535, 487, 709, 374, 378; 361/641
    See application file for complete search history.

(56) References Cited

U.S. PATENT DOCUMENTS

| 5,702,963 | A |  | 12/1997 | Vu et al. |  |
|---|---|---|---|---|---|
| 5,730,495 | A |  | 3/1998 | Tuman, II |  |
| 6,046,400 | A |  | 4/2000 | Drummer |  |
| 6,111,189 | A |  | 8/2000 | Garvison et al. |  |
| 6,143,582 | A |  | 11/2000 | Vu et al. |  |
| 6,201,180 | B1 |  | 3/2001 | Meyer et al. |  |
| 6,219,623 | B1 |  | 4/2001 | Wills |  |
| 6,285,572 | B1 |  | 9/2001 | Onizuka et al. |  |
| 7,301,755 | B2 | * | 11/2007 | Rodriguez et al. | .......... 361/676 |
| 7,632,109 | B2 | * | 12/2009 | Boensch et al. | ............ 439/76.1 |
| 7,648,371 | B2 | * | 1/2010 | Boensch et al. | ............ 439/76.1 |
| 2008/0006321 | A1 | * | 1/2008 | Munch et al. | ............... 136/251 |
| 2008/0194154 | A1 | * | 8/2008 | Minnick | ..................... 439/842 |
| 2009/0142954 | A1 | * | 6/2009 | Boensch et al. | ............ 439/422 |
| 2010/0075531 | A1 | * | 3/2010 | Beck et al. | .................. 439/405 |

OTHER PUBLICATIONS

"Cross-linked polyethylene", http://en.wikipedia.org/wike/XLPE.
"American wire gauge", http://en.wikipedia.org/wiki/American wire gauge.
"Maximum power point tracker", http://en.wikipedia.org/wikiMPPT.

* cited by examiner

*Primary Examiner*—Chandrika Prasad
(74) *Attorney, Agent, or Firm*—David W. Carstens; Jeffrey G. Degenfelder; Carstens & Cahoon, LLP (57) ABSTRACT

The present invention comprises an electrical connector device for electrically connecting an alternating current ("AC") photovoltaic ("PV") solar panel device having an integral micro-inverter to the utility grid. The electrical connector device is a compression connector fitting that includes an upper and lower housing, which each include a channel for receiving the main electrical conductor line. The electrical connector device further includes three electrical prong, which are designed to pierce and penetrate the insulation of the main electrical conductor line to establish an electrical connection between the micro-inverter and the utility grid, when the electrical connector device is compressed about the main electrical conductor line. The shape of the channel formed in the electrical connector device has a distinctive cross-sectional shape that substantially corresponds to the shape of the main electrical conductor line to insure proper alignment and orientation of the main conductor line within the connector device.

20 Claims, 5 Drawing Sheets

CONNECTOR WITH CONDUCTOR PIERCING PRONGS FOR A SOLAR PANEL

CROSS-REFERENCE TO RELATED APPLICATION

This application is a continuation-in-part of U.S. patent application Ser. No. 12/542,600, filed on Aug. 17, 2009, the technical disclosure of which is hereby incorporated herein by reference.

BACKGROUND OF THE INVENTION

1. Technical Field of the Invention

The present invention relates to systems for utilizing power generated by solar panels, and more particularly, to an improved electrical connector for use in a modularized photovoltaic system. The invention provides an electrical connector for quickly and efficiently connecting a fully integrated and self-contained alternating current ("AC") photovoltaic ("PV") solar panel device to an electrical conductor line that allows photovoltaic applications to become true plug-and-use devices.

2. Description of the Related Art

Most of today's solar photovoltaic (PV) power sources are utility connected. About 75% of these installations are residential rooftop systems with less than 2 kW capability. These systems typically comprise a number of PV modules arranged in series configuration to supply a power converter, commonly called an inverter, which changes the direct current (DC) from the modules to alternating current (AC) to match the local electrical utility supply.

The following U.S. patents relate generally to the state of the art in photovoltaic systems U.S. Pat. No. 6,219,623, to Wills; U.S. Pat. No. 6,285,572 to Onizuka; U.S. Pat. No. 6,201,180 to Meyer; U.S. Pat. No. 6,143,582 to Vu; U.S. Pat. No. 6,111,189 to Garvison; U.S. Pat. No. 6,046,400 to Drummer; U.S. Pat. No. 5,730,495 to Barone; and U.S. Pat. No. 5,702,963 to Vu.

In the case of a single module system producing AC power output, the photovoltaic module is connected to the inverter or load through a junction box that incorporates a fuse to protect the photovoltaic module if backfeeding from other sources (e.g., a power utility or a battery) is possible. The photovoltaic modules used in these systems are configured either with a frame or without a frame. Frameless photovoltaic modules are generally referred to as a laminate. For conventional systems that utilize multiple laminates or modules, the laminates or modules are interconnected via junction boxes or flying leads and external wiring that must be rated sunlight resistant and sized to carry the rated currents. Some conventional photovoltaic system installations require that the direct current ("DC") and AC wiring be installed in properly sized and anchored conduit.

A typical method of interconnecting the DC circuits in a conventional photovoltaic system is to have a J-box at the top of each photovoltaic module that provides the terminal block to connect the module circuit to flying-lead conductors that are then fitted with a connector. The J-box also houses the series or "blocking" diode often required by codes and standards to protect the module, especially if more than two strings of modules are paralleled at the combiner box or at the inverter. The module is often constructed with a bypass diode (s) that is (are) usually required for conventional photovoltaic applications. This arrangement is used to connect modules in series. Modules are connected in series until the summed operating voltage is within the optimum DC voltage window of the central or string inverter. The connections are typically made under the modules by plugging connectors together or at distributed junction boxes. Some installations leave insufficient space to allow the installer to make the connections reliably. The central inverter can generally handle multiple strings of photovoltaic modules that are then wired in parallel in a string-combiner assembly or box before DC power is fed to the inverter.

The installation of such a system is quite complicated and typically requires the services of a licensed electrician or certified solar installer. A typical installation usually requires the following steps: 1) attaching a support rack to the roof; 2) attaching solar panel arrays to the support rack; 3) adding a circuit breaker to the main electrical system; 4) adding an electrical line from main electrical panel external to AC disconnect; 5) adding an electrical line from AC disconnect to inverter; 6) adding an electrical line from inverter to DC disconnect; 7) adding an electrical line from DC disconnect to combiner box; 8) adding an electrical line from the combiner box to the roof; 9) adding an electrical line to the first and last solar panel array in the string; and 10) adding electrical connections between the solar panel arrays. Typically, all electrical connections in such systems are manually spliced by removing the insulation from each wire to form a proper electrical connection before reinsulating the joined wires.

There is also a difficulty with small solar power systems on residential rooftops. Gables and multiple roof angles make it difficult on some houses to obtain enough area having the same exposure angle to the sun for a system of 2 kW. A similar problem arises where trees or gables shadow one portion of an array, but not another. In these cases the DC output of the series string of modules is reduced to the lowest current available from any cell in the entire string. This occurs because the PV array is a constant current source unlike the electric utility, which is a constant voltage source.

An inverter that economically links each PV module to the utility grid can solve these problems as the current limitation will then exist only on the module that is shaded, or at a less efficient angle and does not spread to other fully illuminated modules. This arrangement can increase total array output by as much as two times for some configurations. Such a combination of a single module and a micro-inverter is referred to as a PV AC module. The AC output of the micro-inverter will be a constant-current AC source that permits additional units to be added in parallel.

While a variety of proposals directed at PV AC modules have previously been made, none have includes a simple efficient means for connecting to the utility grid. Prior art models of PV AC modules suffer poor reliability owing to early failure of the electrolytic capacitors that are used to store the solar cell energy before it is converted to AC. The capacitor aging is a direct consequence of the high temperature inherent in rooftop installations. Moreover, such PV AC modules do not include a simple and efficient means for connection to the utility grid. A need, therefore, exists for an improved and more efficient method and apparatus for safely connecting such PV AC modules to the electrical utility grid.

SUMMARY OF THE INVENTION

The present invention overcomes many of the disadvantages of prior art photovoltaic ("PV") solar panel devices by providing fully integrated and self-contained alternating current ("AC") photovoltaic ("PV") solar panel device, which features an integral micro-inverter having a novel connector device for electrically connecting to the utility grid. The electrical connector device comprises a compression connector fitting having a channel formed therethrough for receiving the main electrical conductor line. The cross-sectional shape of the channel substantially corresponds to the cross-sectional shape of the conductor line. The housing of the connector device comprises an upper and lower portion, each having a portion of the channel or cavity formed therein. The housing may further include a sealing lip on the periphery of the upper and lower portions that is moisture and dust resistant.

The electrical connector device further includes three electrical prong devices configured in the channel cavity, which are designed to pierce and penetrate the insulation of the main electrical conductor line, upon compression onto the main electrical conductor line. The three electrical prong devices are electrically connected to the electrical output of the micro-inverter. By piercing and penetrating the insulation of the main electrical line, the prongs establish an electrical connection between the electrical output of the micro-inverter and the utility grid. The electrical prongs are laterally spaced across the width of the channel to form three separate connections with three conductor wires encased in the main electrical conductor line. The electrical prongs may also be spaced at intervals along the length of the channel.

In one embodiment, the connector fitting is fixably attached to the main electrical conductor line by means of compressively crimping the main electrical conductor line in the channel formed in the upper and lower portions of the connector device. In another embodiment, the connector device may comprise a snap together device, wherein the upper and lower housing portions snap together compressing the main electrical conductor line in the channel formed between them. In another embodiment, the upper and lower housing portions are joined by adhesive bond. In a preferred embodiment, the connector device comprises a compression connector fitting which include fasteners (e.g., bolts and helical screws) for mechanically coupling the connector fitting about the main electrical conductor line.

The micro-inverters are configured on the back of each solar panel. Each micro-inverter converts DC power generated by its respective solar panel to grid-compliant AC power and are known to exhibit high conversion efficiency. Moreover, there are no moving parts to wear out or maintain.

In addition, unlike prior art string systems, the solar panels of the present invention operate a maximum power point tracking (MPPT), increasing energy output 5-25%. They also exhibit an increased resilience to shade, dust and debris and are capable of high levels of power production even in variable light conditions. By incorporating a micro-inverter into each solar panel, each solar panel produces power independently of the others; thus, eliminating the possibility that a single point failure will disable the entire system. The micro-inverters have a very low internal temperature rise and a long lifetime. They also eliminate the space, heat, noise and visual concerns with large string inverter systems.

Furthermore, by using the compression connector fittings, the solar panels are easy to install and dramatically reduced installation cost, time and space. The system of the present invention offers maximum flexibility in that solar panels can be easily added in any quantity, orientation, location even to any existing solar system.

In accordance with one feature of the invention, a method of installation is disclosed which includes the following steps: 1) attach a support rack to a roof; 2) attach a plurality of solar panels to the rack; 3) add a circuit breaker to the main electrical system; 4) add a main electrical conductor line from main electrical panel to roof; and 5) connect each solar panel to the main electrical conductor line using its respective compression connector fitting.

BRIEF DESCRIPTION OF THE DRAWINGS

A more complete understanding of the method and apparatus of the present invention may be had by reference to the following detailed description when taken in conjunction with the accompanying drawings, wherein.

Where used in the various figures of the drawing, the same numerals designate the same or similar parts. Furthermore, when the terms "top," "bottom," "first," "second," "upper," "lower," "height," "width," "length," "end," "side," "horizontal," "vertical," and similar terms are used herein, it should be understood that these terms have reference only to the structure shown in the drawing and are utilized only to facilitate describing the invention.

All figures are drawn for ease of explanation of the basic teachings of the present invention only; the extensions of the figures with respect to number, position, relationship, and dimensions of the parts to form the preferred embodiment will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

DETAILED DESCRIPTION OF THE INVENTION

The present invention overcomes many of the prior art problems associated with solar panel arrays. The advantages, and other features of the systems and methods disclosed herein, will become more readily apparent to those having ordinary skill in the art from the following detailed description of certain preferred embodiments taken in conjunction with the drawings which set forth representative embodiments of the present invention and wherein like reference numerals identify similar structural elements.

Figure 1:
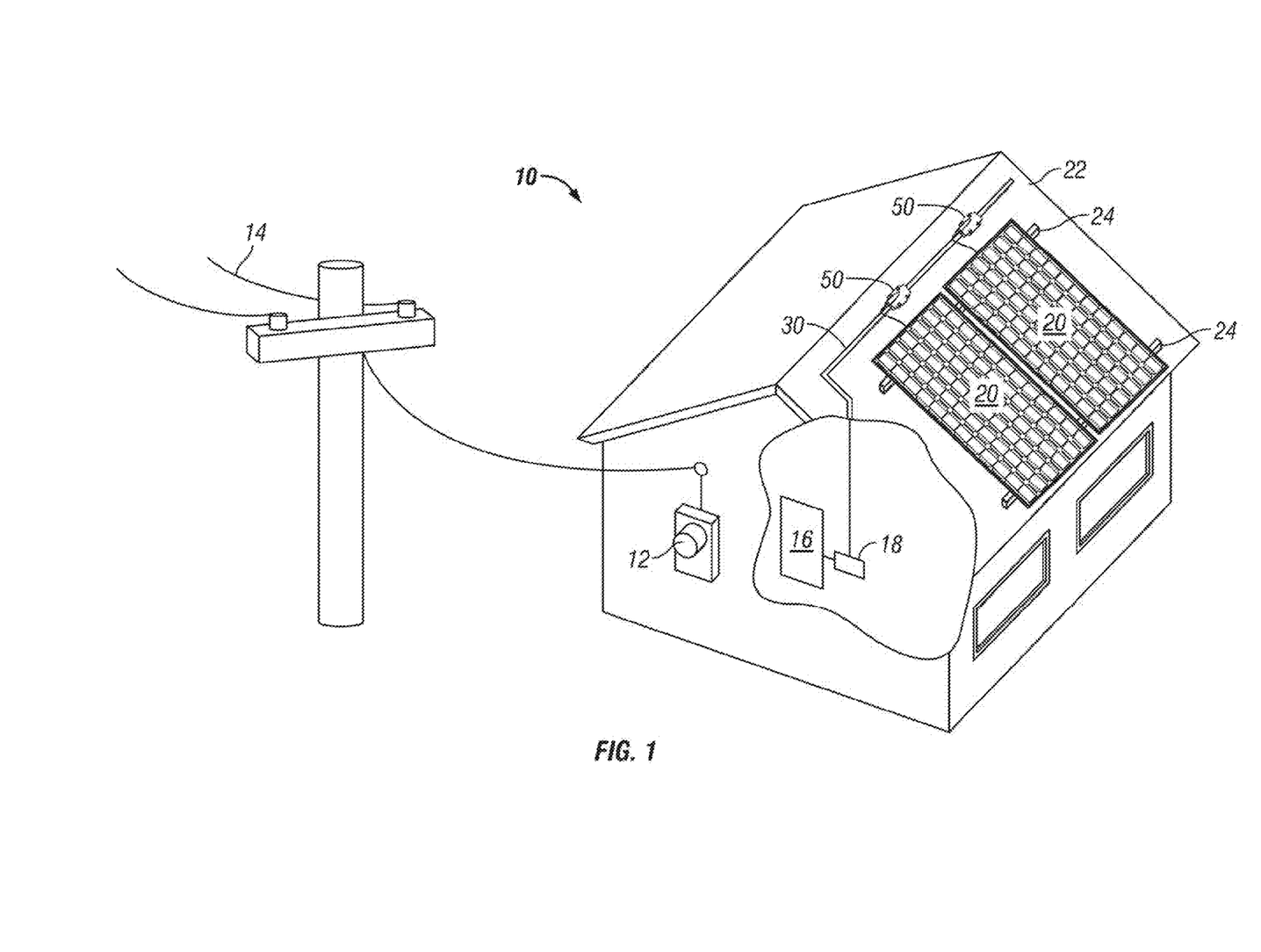
FIG. 1 is a perspective view of an embodiment of the solar panel system of the present invention.

With reference to the Figures, and in particular to FIG. 1, an embodiment of the system 10 of the present invention is depicted. The system 10 includes one or more solar panels 20 mounted on a support rack 24 configured on the roof 22 of a building. The support rack 22 may comprise wooden boards or metal tubing sufficient to displace the solar panels 20 above surface of the roof 22. Suspending the solar panels 20 above the surface of the roof 22 allows air to freely circulate beneath the solar panels 20.

Figure 2:
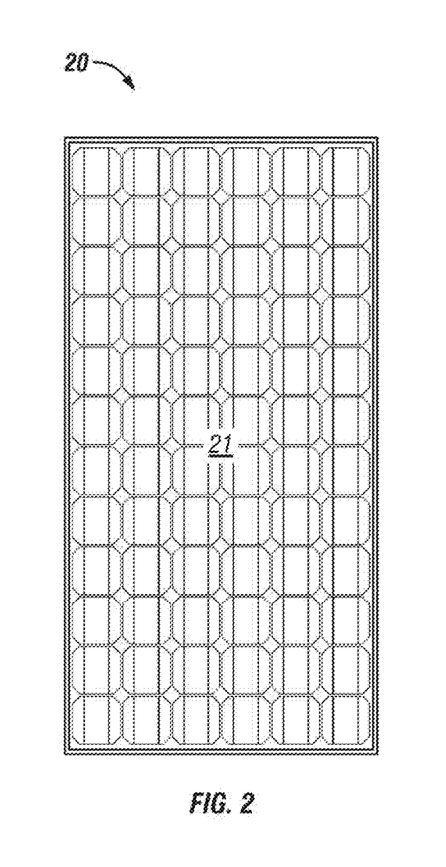
FIG. 2 is a front elevation view of an embodiment of a solar panel of the present invention.
Figure 3:
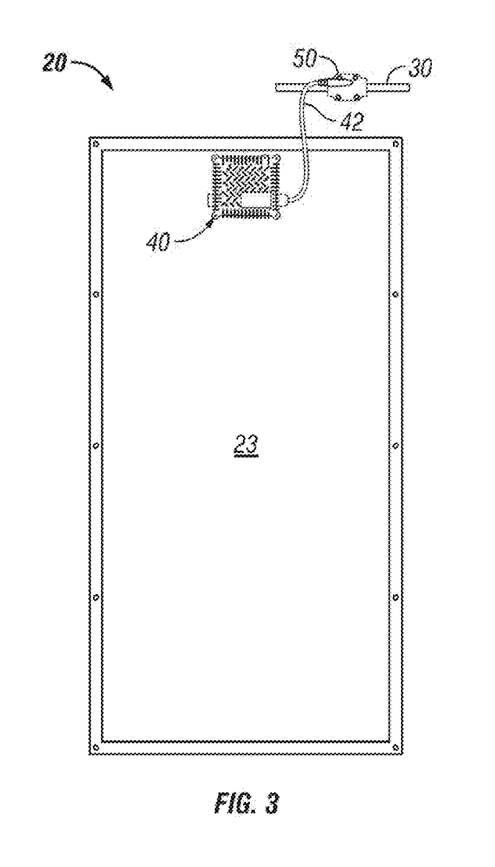
FIG. 3 is a back elevation view of an embodiment of a solar panel of the present invention.

As shown in FIGS. 2 and 3, each solar panel 20 includes a front or facing side 21, which is covered with a photovoltaic material. Each solar panel 20 further includes a fully integrated and self-contained micro-inverter device 40, which converts DC power generated by its respective solar panel into grid-compliant AC power. The solar panel 20 is preferably capable of generating 180-200 W of electrical power. The integral micro-inverter device 40 is configured on the back or underside 23 of the solar panel 20. The micro-inverter device 40 has high conversion efficiency, but no moving parts to wear out or maintain. Moreover, the micro-inverter device 40 exhibits very low internal temperature rise and a long lifetime.

Figure 4:
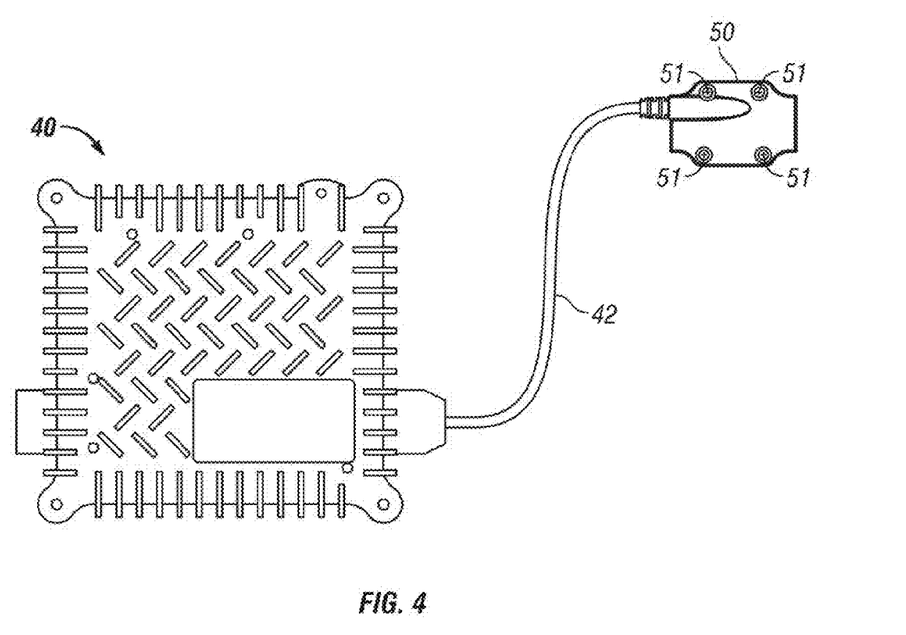
FIG. 4 depicts the micro-inverter device attached to the solar panel of the present invention

As shown in FIG. 4, each micro-inverter device 40 includes an insulated pigtail wire 42 extending therefrom, which has an electrical connector device 50 on its distal end. In a preferred embodiment, the pigtail wire 42 comprises three 18 AWG tinned copper conductor wires that are stranded and coated with cross-linked polyethylene (XLPE) insulation. The three conductor wires are further encased with a sun resistant polyvinyl chloride (PVC) jacket. The preferred embodiment of the pigtail wire 42 is rated at 600V, 105° C. Dry, 90° C. Wet, UL3173 conductors, overall TC direct burial. The electrical connector device 50 is a compression fitting that electrically connects the micro-inverter device 40 to the utility grid system. The electrical connector device 50 selectively connects its respective micro-inverter device 40 to the utility grid system via a main electrical conductor line 30.

The main electrical conductor line 30 comprises a heavily clad electrical conductor connected to the utility grid system. The main electrical conductor line 30 is connected to a main electrical panel 16, which in turn is electrically connected to the utility power grid 14 via an electric meter 12. An optional monitor device 18 may also be included in the electrical circuit.

Figure 5:
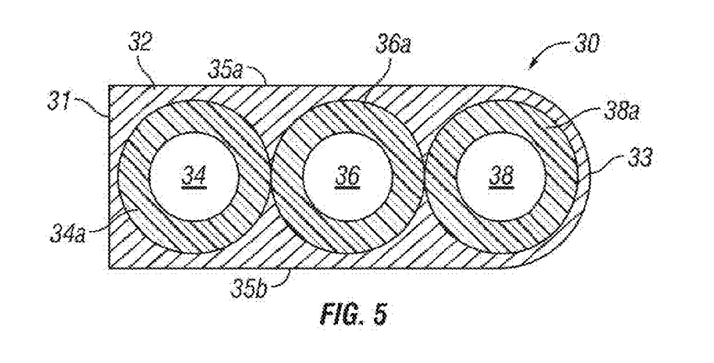
FIG. 5 is a close-up, cross-sectional view of an embodiment of the main electrical conductor line of the present invention.

For example, with reference to FIG. 5, in a preferred embodiment, the main electrical conductor line 30 comprises three conductor wires 34, 36, 38 encased in a PVC jacket. One wire (e.g., 34) serves as the live wire, another wire (e.g., 36) serves as the grounding wire, and the remaining wire (e.g., 38) serves as the neutral wire. In addition, each of the three conductor wires 34, 36, 38 may be sheathed in a separate insulative coating 34a, 36a, 38a and color coded for ease of use. For example, and in conformity with standard electrical wire coloring, wire 24 may be sheathed with insulation 34a that is black in color, wire 36 may covered with insulation 36a that is green in color and wire 38 may covered with insulation 38a that is white in color. In addition, the PVC cladding or jacket 32 may include coloring or graphical notations (not shown) to denote the configuration of the electrical conductor wires 34, 36, 38 encased therein.

In a preferred embodiment, the main electrical conductor line 30 comprises three 12 gauge tinned copper conductor wires 34, 36, 38 having a 65/30 stranding, and insulated with XLPE. The three conductor wires 34, 36, 38 are jacketed in PVC. The main electrical conductor line 30 is rated at 600 V, 90° C. Wet, UL3173 conductors, overall TC direct burial.

In a preferred embodiment, the PVC jacket also has a distinctive cross-sectional shape, which assists in properly configuring the conductor line 30 within the connector device 50. The distinctive cross-sectional shape is characterized by having two opposing sides that exhibit distinct geometric shapes that differ from each other. Any distinctive shape (e.g., squared-off, circular, bi-angular, multiple faceted or even indentations) may be used for the two opposing sides so long as they exhibit a differing geometric shape from one another. For example, as shown in FIG. 5, in a preferred embodiment the main electrical conductor line 30 includes a squared-off side 31, which is substantially perpendicular to the top 35a and bottom 35b sides, and a rounded side 33.

The distinctive cross-sectional shape of the main electrical conductor line 30 is designed to correspond to the shape of the channel 53 formed through the electrical connector device 50. As will be explained shortly, the distinctive cross-sectional shape prevents the conductor line 30 from being improperly oriented within the connector device 50.

With reference now to FIGS. 6A-6D, the present invention includes an electrical connector device 50, which is a compression fitting for electrically connecting the micro-inverter device 40 safely and efficiently to the utility grid system. The electrical connector device 50 may be constructed on any high strength plastic or other non-conductive material. The electrical connector device 50 receives electrical current from the micro-inverter device 40 via the insulated pigtail wire 42 and transfers it to the electrical conductor line 30 via electrical prongs 60. The electrical prongs 60 extend into the channel 53 and are electrically connected to the micro-inverter device 40 via the insulated pigtail wire 42.

The electrical connector device 50 is designed so that when the electrical conductor line 30 is properly configured in the channel 53, which extends through the device 50, and the connector device 50 is compressed around the line 30, the electrical prongs 60 are forced through the cladding or jacket 32 and insulation to establish an electrical connection with the conductor wires 34, 36, 38 contained within the electrical conductor line 30.

The cross-section of the channel 53 formed through the electrical connector device 50 corresponds substantially to the previously discussed distinctive cross-sectional shape of the electrical conductor line 30. The distinctive cross-sectional shape of the electrical conductor line 30 insures that the conductor line will be configured properly within the receiving channel 53.

Figure 6A:
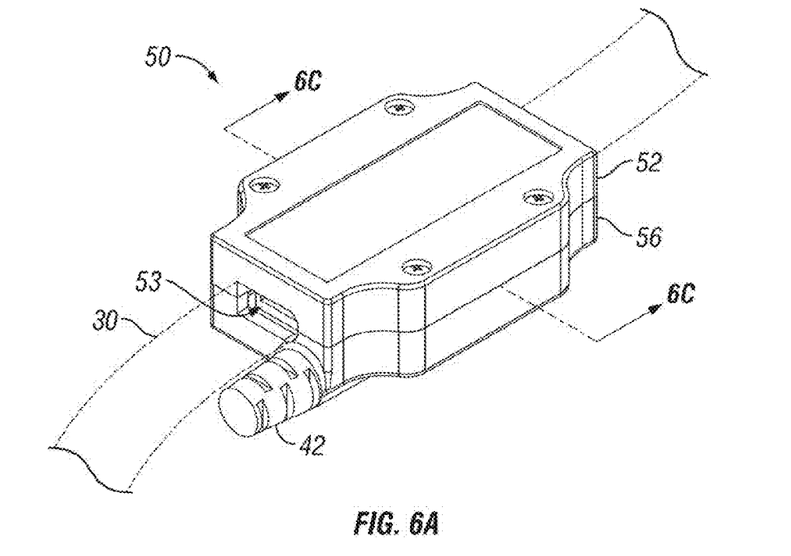
FIG. 6A is a perspective view of an embodiment of the compression connector fitting of the present invention in a closed position.

For example, as shown in the preferred embodiment depicted in FIGS. 6A-6D, the electrical connector device 50, comprises a housing that includes a lower portion 56 having a cavity or channel half 53b formed therein, and an upper portion 52 having a cavity or channel half 53a formed therein; such that when the lower 56 and upper 52 portions are configured in a closed position as depicted in FIG. 6A, the main electrical conductor line 30 is tightly surrounded by the electrical connector device 50. The geometric cross-section of the resulting channel 53, which substantially corresponds to the cross-section of the main electrical conductor line 30, ensures a snug, moisture and dust resistant fit of the conductor line 30 within the connector device 50. Moreover, the distinctive geometrically shaped sides 31, 35 ensure that the conductor line 30 is properly oriented and configured within the connector device 50.

The electrical connector device 50 may further include slots 54, 57 formed in the upper 52 and lower 56 portions and inserts 58 for assisting in aligning the two portions relative to one another. As shown in the embodiment depicted in FIG. 6B, one slot and its corresponding insert may be substantially longer than the other slot ensuring that the two portions 52, 56 are properly aligned prior to coupling. In addition, the inserts 58 may be permanently affixed or formed in either the upper or lower slots for ease of retention.

The outer periphery of upper portion 52 of the electrical connector device 50 may also include a lip 59a which corresponds to a lip 59b formed in the outer periphery of the lower portion 56. As shown best in FIG. 6C, when the upper 52 and lower 56 portions are properly aligned and joined the two lips 59a, 59b form an interlocking moisture and dust resistant seal to the interior of the electrical connector device 50.

The connector device 50 is fixably attached to the main electrical conductor line 30 by means of compressively crimping the connector device 50 onto the main electrical conductor line 30. For example, in one embodiment, the upper 52 and lower 56 portions of the connector device 50 may simply snap together in a compressive bond, which compresses the main electrical conductor line 30 between them. In another embodiment, the upper 52 and lower 56 housing portions are joined together by adhesive bond. In another embodiment, the connector fitting may include fasteners (e.g., bolts and screws) for mechanically coupling the connector fitting about the main electrical conductor line 30.

Figure 6B:
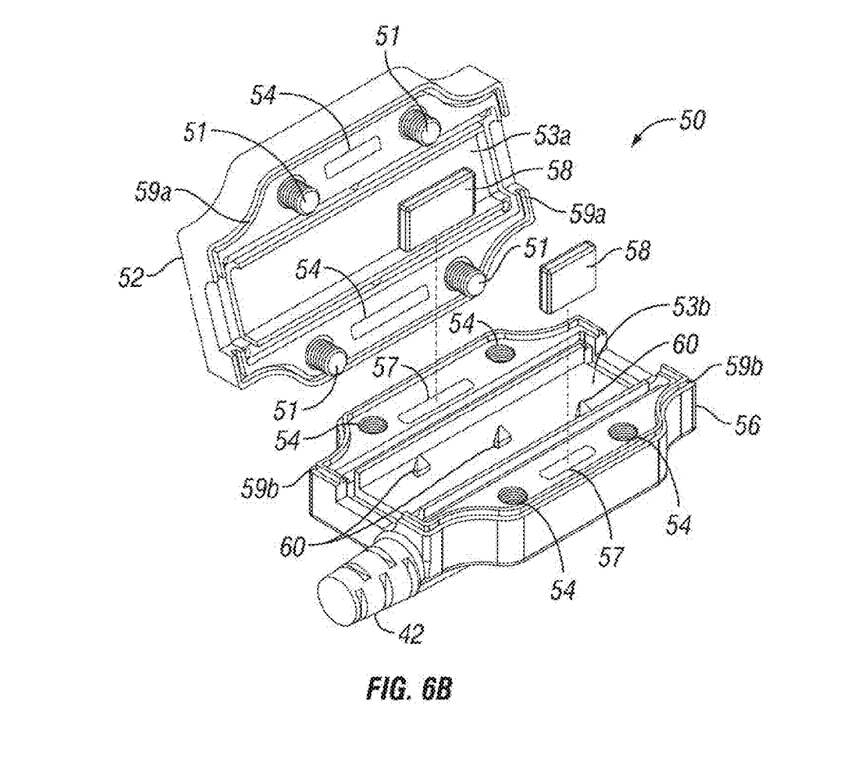
FIG. 6B is a partially exploded view of an embodiment of the compression connector fitting of the present invention in an opened position.

For example, as shown in the embodiment depicted in FIGS. 6A and 6B, the upper 52 portion of the connector device 50 includes screw fasteners 51 which correspond to threaded inserts 54 formed in the lower portion 56 of the connector device 50. The threaded inserts 54 are typically fixed within the lower portion 56 of the connector device 50, while the screw fasteners 51 freely rotate. In a preferred embodiment, the screw fasteners 51 are captured within the upper 52 portion of the connector device 50 to prevent them from falling out when the upper portion 52 is uncoupled from the lower portion 56. When rotatively coupled, the screw fasteners 51 and corresponding threaded inserts 54 compress the upper 52 and lower 56 portions of the connector device 50 together about the main electrical conductor line 30.

Figure 6C:
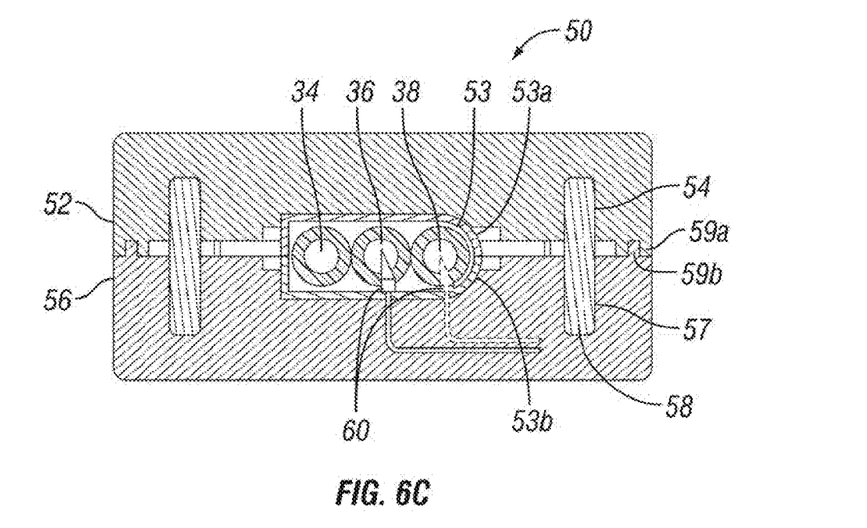
FIG. 6C is a close-up, cross-sectional view of the embodiment of the compression connector fitting and main electrical conductor line of the present invention shown in FIG. 6A.
Figure 6D:
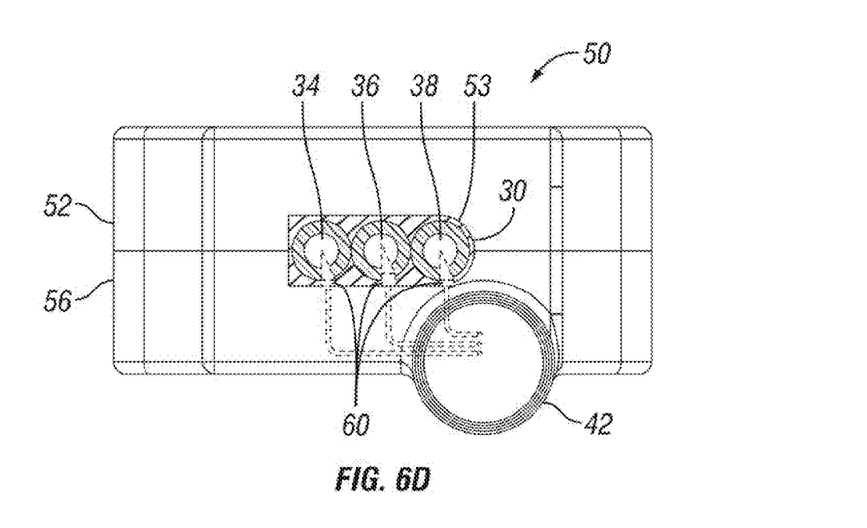
FIG. 6D is a front elevation view of the embodiment of the compression connector fitting and main electrical conductor line of the present invention shown in FIG. 6A.

As shown in FIGS. 6B-6D, the electrical connector device 50 also includes three prongs 60, which extend outward into the channel 53. The prongs 60 pierce the cladding and insulation of the main electrical conductor line 30 as the upper 52 and lower 56 portions of the connector device 50 are compressed about the main electrical conductor line 30. The three prongs 60 are electrically connected to the electrical output of the micro-inverter device via the insulated pigtail wire 42 extending from the micro-inverter device 40. As shown in FIGS. 6C-6D, the electrical prongs 60 are laterally spaced across the width of the channel 53 to form three separate electrical connections with three conductor wires 34, 36, 38 encased in the main electrical conductor line 30. The three prongs 60 pierce the cladding and insulation surrounding the three conductor wires 34, 36, 38 completing the electrical connection between the micro-inverter device 40 and the utility power grid 14.

As shown in the Figures, in the preferred embodiment, the prongs 60 are positioned at spaced intervals along the length of the channel half 53b formed in the lower portion 56 of the electrical connector device 50. It is understood, however, that in other embodiments the prongs 60 could be aligned parallel to one another at a single point along the length of the channel half 53b. The distinctive shape of channel 53, which corresponds to the distinctive cross-sectional shape of the main electrical conductor line 30, ensures that the configuration and orientation of the electrical conductor line 30 in relation to the electrical prongs 60 is consistent and proper.

Thus, an installer can quickly and easily orient the electrical prongs 60 relative to the three conductor wires 34, 36, 38 encased in the main electrical conductor line 30 by matching the distinctive geometric shaped conductor line 30 to the corresponding shape of the channel 53 formed through the connector device 50. The connector device 50 allows an installer to safely and efficiently connect each solar panel 20 to the main electrical conductor line 30 in a true plug-and-use manner.

As sunlight shines on them, each solar panel 20 generates DC electrical power, which is converted into grid-compliant AC electrical power by its respective micro-inverter device 40. Because each solar panel 20 produces power independently of the others, the failure of one solar panel does not adversely affect power output of the remaining solar panels. Moreover, the present invention is capable of operating at a maximum power point tracking (MPPT), thereby increasing energy output 5-25%.

The maximum number of solar panels attached to a system is dictated by the size of the main electrical conductor line 30 and the limit of the circuit breaker in the main electrical panel 16. For example, utilizing a 15 amp breaker in conjunction with 14 gauge wire allows up to nine (9) solar panels 20 to be connected to the main electrical conductor line 30, while utilizing a 20 amp in conjunction with 12 gauge wire allows up to twelve (12) solar panels 20 to be connected to the a main electrical conductor line 30.

In accordance with the method of the present invention, the installation of the present system is greatly simplified and does not require a licensed electrician or certified solar installer to successfully and safely install. The method includes the following steps:

1) attach a support rack 24 to a roof 22;
2) attach a plurality of solar panels 20 of the present invention to the rack 24;
3) adding a circuit breaker to the main electrical panel 16;
4) adding a main electrical conductor line 30 from main electrical panel 16 to roof 22; and
5) compressing or crimping the panel connector fittings 50 onto main electrical conductor line 30.

The system 10 of the present invention eliminates the space, heat, noise and visual concerns with large string inverter systems. Moreover, it exhibits an increased resilience to shade, dust and debris while producing high levels of electrical power even in variable light conditions. Because of the ease and simplification in connecting the connector fittings 50 onto main electrical conductor line 30 the resulting installation costs, time and space are dramatically reduced. Moreover, the system offers maximum flexibility in that the solar panels 20 can be easily added in any quantity, orientation, location even to any existing solar system.

It will now be evident to those skilled in the art that there has been described herein an improved modularized photovoltaic system. The invention provides a fully integrated and self-contained alternating current ("AC") photovoltaic ("PV") solar panel device and method that allows photovoltaic applications to become true plug-and-use devices. Although the invention hereof has been described by way of a preferred embodiment, it will be evident that other adaptations and modifications can be employed without departing from the spirit and scope thereof. The terms and expressions employed herein have been used as terms of description and not of limitation; and thus, there is no intent of excluding equivalents, but on the contrary it is intended to cover any and all equivalents that may be employed without departing from the spirit and scope of the invention.

I claim:

1. A connector device for establishing an AC electrical connection between a solar panel and a utility grid comprising:

a housing having a channel formed therethrough and having three prongs extending into said channel, said three prongs being electrically connected to an AC electrical output of a micro-inverter device integral to said solar panel;

wherein said three prongs establish an electrical connection between said micro-inverter device and a conductor line, which is electrically connected to said utility grid, by piercing and penetrating said conductor line when said housing is compressed about said conductor line.

2. The connector device of claim 1, wherein said housing comprises an upper and a lower portion for capturing said conductor line therebetween.

3. The connector device of claim 2, wherein said upper and lower portion each have a portion of said channel formed therein.

4. The connector device of claim 2, wherein said upper and lower portions of said housing snap together in a compressive bond.

5. The connector device of claim 2, wherein said upper and lower portions of said housing are joined with adhesive bonding.

6. The connector device of claim 2, wherein said upper portion further comprises a screw fastener which corresponds to a threaded insert formed it said lower portion for compressing said housing about said conductor line.

7. The connector device of claim 6, wherein said screw fastener is captured within said upper portion.

8. The connector device of claim 1, wherein said upper portion has a first slot formed therein which corresponds to a second slot formed in said lower portion to assist in properly aligning said upper portion to said lower portion.

9. The connector device of claim 8, further comprising an alignment insert which fits in said first and second slots to properly align said upper portion to said lower portion.

10. The connector device of claim 1, wherein said channel has a geometric cross-section that is substantially similar to a geometric cross section of said conductor line.

11. The connector device of claim 10, wherein said geometric cross-section of said conductor line includes two opposing sides with dissimilar geometric shapes to assist in aligning said conductor line in said channel.

12. The connector device of claim 11, wherein said cross-section of said conductor line has one side that is squared off and an opposing side that is rounded.

13. The connector device of claim 1, wherein said prongs are laterally spaced across the width of said channel.

14. The connector device of claim 1, wherein said prongs are spaced at intervals along the length of said channel.

15. The connector device of claim 1, further comprising a sealing mechanism on said upper and lower portions that is moisture and dust resistant.

16. The connector device of claim 15, wherein said sealing mechanism comprises interlocking corresponding lips on the periphery of said upper and lower portions.

17. The connector device of claim 1, wherein said conductor line comprises three conductor wires encased in an insulative jacket.

18. The connector device of claim 17, wherein said insulative jacket is polyvinyl chloride (PVC).

19. The connector device of claim 17, wherein each of said conductor wires are sheathed in an insulative coating.

20. The connector device of claim 15, wherein said insulative coating is cross-linked polyethylene.

* * * * *